United States Patent
Luo et al.

(10) Patent No.: US 7,972,527 B2
(45) Date of Patent: Jul. 5, 2011

(54) METHOD OF MAKING TERNARY PIEZOELECTRIC CRYSTALS

(75) Inventors: Jun Luo, State College, PA (US); Wesley S. Hackenberger, State College, PA (US)

(73) Assignee: TRS Technologies, Inc., State College, PA (US)

( * ) Notice: Subject to any disclaimer, the term of this patent is extended or adjusted under 35 U.S.C. 154(b) by 612 days.

(21) Appl. No.: 12/023,646

(22) Filed: Jan. 31, 2008

(65) Prior Publication Data

US 2009/0194732 A1   Aug. 6, 2009

(51) Int. Cl.
*H01L 47/187* (2006.01)
*C04B 35/499* (2006.01)

(52) U.S. Cl. ............ 252/62.9 R; 252/62.9 PZ; 117/948; 117/949; 117/81

(58) Field of Classification Search .................. 117/948, 117/949; 252/62.9 R, 62.9 PZ
See application file for complete search history.

(56) References Cited

U.S. PATENT DOCUMENTS

| | | | |
|---|---|---|---|
| 5,342,475 A | 8/1994 | Yoshida et al. | |
| 5,804,907 A | 9/1998 | Park et al. | |
| 5,859,211 A | 1/1999 | Kreuder et al. | |
| 5,998,910 A | 12/1999 | Park et al. | |
| 6,238,481 B1 | 5/2001 | Yamashita et al. | |
| 2006/0012270 A1 | 1/2006 | Han | |
| 2006/0091353 A1* | 5/2006 | Matsushita et al. | 252/62.9 R |

FOREIGN PATENT DOCUMENTS

JP   2007243200   9/2007

OTHER PUBLICATIONS

Luo J et al., Advances in Manufacturing Relaxor Piezpelectric Single Crystals', Applications of Ferroelectrics, 2007, ISAF 2007, Sixteenth IEEE International Symposium on, IEEE, Pl, May 1, 2007, pp. 557-560, XP031167419, ISBN: 978-1-4244-1333-1.

Luo J et al., "Elastic, Piezoelectric and Dielectric Properties of PIN-PMN-PT Crystals Grown by Bridgman Method", Ultrasonics Symposium, 2008, IUS 2008, IEEE, IEEE, Piscataway, NJ, USA, Nov. 2, 2008, pp. 261-264, XP031443375, ISBN: 978-1-4244-2428-3.

* cited by examiner

*Primary Examiner* — C. Melissa Koslow
(74) *Attorney, Agent, or Firm* — McNees Wallace & Nurick LLC

(57) ABSTRACT

A ternary single crystal relaxor piezoelectric grown from a novel melt using the Vertical Bridgeman method. The ternary single crystals are characterized by a Curie temperature, $T_c$, of at least 150° C. and a rhombohedral to tetragonal phase transition temperature, $T_{rt}$, of at least about 110° C. The ternary crystals further exhibit a piezoelectric coefficient, $d_{33}$, in the range of at least about 1200-2000 pC/N.

17 Claims, 3 Drawing Sheets

US 7,972,527 B2

METHOD OF MAKING TERNARY PIEZOELECTRIC CRYSTALS

STATEMENT REGARDING FEDERALLY-SPONSORED RESEARCH

The U.S. Government has a paid-up license in this invention and the right in limited circumstances to require the patent owner to license others on reasonable terms as provided for by the terms of contract number N00014-06-M-0226 awarded by the United States Department of the Navy.

FIELD OF THE INVENTION

The present invention is directed to a method of manufacturing piezoelectric single crystals and specifically, ternary piezoelectric single crystals for use at higher temperatures and in higher power applications.

BACKGROUND OF THE INVENTION

Binary single crystal relaxor ferroelectrics such as $Pb(Mg_{1/3}Nb_{2/3})_{1-x}Ti_xO_3$ (PMN-PT) have shown great promise for broad bandwidth transducers. Such a binary single crystal has an elastic compliance that is about 4.5 times greater than that of $PbZrO_3$—$PbTiO_3$, a traditional piezoelectric ceramic of which Type I PZT is commonly used in a broad range of applications. The material also has a piezoelectric coefficient $d_{33}$ that is 6.5 times that of Type I PZT and an electromechanical coupling coefficient $k_{33}$ that is greater than about 90%, whereas $k_{33}$ for Type I PZT is less than about 70%. The improved elastic compliance allows the PMN-PT to be provided at a dramatically reduced element size for a predetermined resonant frequency. The improved piezoelectric coefficient allows the smaller element to maintain acoustic intensity. The improved coupling coefficient provides a larger operating bandwidth, which is important for a power delivery system. In addition, the improved coupling coefficient $k_{33}$ provides high receive sensitivity further above the fundamental resonance frequency than is the case with a ceramic.

However, the use of a binary single crystal relaxor such as PMN-PT is limited due to its low Curie temperature, $T_c$, and morphotropic behavior, that is, the phase transition from rhombohedral to tetragonal at a phase transition temperature $T_{rt}$. The $T_c$ is an important parameter because the class of materials that includes the single crystal relaxor ferroelectrics does not recover once the single crystal relaxor ferroelectrics $T_c$ is exceeded without application of a large electric field to re-polarize the crystal. The vibration characteristics of the material are partially lost once the $T_{rt}$ is exceeded, and these characteristics do not recover if the temperature is lowered. For a material used in ultrasonic applications, these vibration characteristics are a critical property, and the $T_{rt}$ limits the maximum use temperature of the crystal. The dielectric constant and piezoelectric coefficient of PMN-PT are also highly temperature dependent. For example, PMN-33%PT has a 75% change in dielectric constant in the temperature range of 0-50° C. (32-122° F.). This change adversely affects transducer impedance and matching circuitry, which in turn affects the power delivery system. Thus, a dielectric constant that does not change significantly with temperature is important for reliable operation such a system.

For applications in which space is an issue, such as sonar applications, such temperature dependence affects performance. The power required to drive the electronic circuitry continues to increase with complexity of the circuits, which further increases the operating temperatures of the crystals and all of the equipment associated with such applications in such confined spaces. PMN-PT also has a coercive field which is six times lower than Type I PZT ceramic, so that an electrical bias has to be applied to keep the crystal from depoling during high driving, bipolar applications.

Efforts have been made to overcome the disadvantages of PMN-PT. New binary crystals that possess higher Curie temperatures have been developed such as $Pb(Sc_{1/2}Nb_{1/2})O_3$-$PbTiO_3$ (PSN-PT), $Pb(Sc_{1/2}Ta_{1/2})O_3$-$PbTiO_3$(PST-PT), $Pb(Yb_{1/2}Nb_{1/2})O_3$-$PbTiO_3$ (PYN-PT), $Pb(In_{1/2}Nb_{1/2})O_3$-$PbTiO_3$ (PIN-PT), $Pb(Co_{1/3}Nb_{2/3})O_3$-$PbTiO_3$ (PCN-PT) and $Pb(Co_{1/2}W_{1/2})O_3$-$PbTiO_3$(PCW). Each has a relatively high $T_c$ near their morphotropic phase boundary compositions. However, their crystal growth is limited due to the instability of the perovskite phase in the melts of these materials. Thus, it is difficult to grow single crystals from melts of these compositions, due to the slow growth rates and instability. While these binary materials have a promising $T_c$, in the range of 260-360° C. (500-680° F.) and a phase transition temperature of 50-160° C. (122-320° F.), small sized, polycrystalline crystal grains typically result due to this instability. These polycrystalline grains are not practical since they do not result in single crystals of sufficient size which can be produced at a reasonable cost, if they can be produced at all.

Increasing the temperature usage range of the PMN-PT has also been attempted by developing relaxor-PMN-PT ternary systems such as $Pb(Sc_{1/2}Nb_{1/2})O_3$-$Pb(Mg_{1/3}Nb_{2/3})O_3$-$PbTiO_3$,(PSN-PMN-PT), $Pb(Yb_{1/2}Nb_{1/2})O_3$-$Pb(Mg_{1/3}Nb_{2/3})O_3$-$PbTiO_3$ (PYN-PMN-PT), $Pb(In_{1/2}Nb_{1/2})O_3$-$Pb(Mg_{1/3}Nb_{2/3})O_3$-$PbTiO_3$ (PIN-PMN-PT) and $Pb(Mg_{1/3}Nb_{2/3})O_3$-$PbZrO_3$-$PbTiO_3$ (PMN-PZ-PT). In the ternary PIN-PMN-PT, higher mole percentages of PIN produce improved $T_{rt}$ and an improved coercive field, Ec, as compared to binary PMN-PT crystals, while other dielectric properties and piezoelectric properties remain similar to PMN-PT crystals. However, one of the drawbacks with such ternaries has been a limitation on the PIN concentration, as no concentrations higher than 28 mole % have been grown by the Vertical Bridgeman method due to the difficulty in preventing the formation of secondary phases, in particular, the pyrochlore phase during the crystal growth process.

What is needed are single crystal ternary materials that can be conventionally grown for use as transducers that are capable of use at higher temperatures. These crystals must have a higher Curie temperature $T_c$, so that they can be driven at higher powers in higher temperature environments. In addition, these materials should have a dielectric constant that is as flat as possible across the temperature range of operation. It is also desirable that the single crystal materials of the present invention do not have a $T_{rt}$ that is within the operating range.

SUMMARY OF THE INVENTION

A ternary single crystal relaxor piezoelectric that can be grown from a novel melt using the Vertical Bridgeman method is provided. The ternary single crystals are characterized by a Curie temperature, $T_c$, of at least 150° C. and a rhombohedral to tetragonal phase transition temperature, $T_{rt}$, of at least about 110° C. The ternary crystals further exhibit a piezoelectric coefficient, $d_{33}$, in the range of at least about 1200-2000 pC/N (where pico (p) is $10^{-12}$), C is the short circuit charge density and N is applied force), and an $E_c$ in the range of about 2.5-7.5 kv/cm.

The ternary single crystal relaxor piezoelectrics are grown by the vertical Bridgeman method using precursor methods that avoid the formation of the pyrochlore phase during crystal growth. Even a small amount of a secondary phase formed during the raw material batching process can segregate to the crystal growth interface during solidification (crystal growth phase), breaking down the stability of this interface, resulting in defect formation or polycrystallinity.

Further, there is provided a method for fabricating a relaxor ternary single crystal piezoelectric material, comprising the steps of providing a columbite precursor by first calcining at high temperature $Nb_2O_5$ and MgO preferably at temperatures in the range of about 1050-1250° C. (1922-2282° F.) and then calcining the columbite precursor with PbO at low temperatures to form a pure perovskite phase. A second pure perovskite phase is optionally provided as the second ingredient, when the ternary crystal is PIN-PMN-PT, by providing a wolframite precursor by calcining at high temperature $Nb_2O_5$ and $In_2O_3$, preferably in the temperature range of about 1050-1250° C. (1922-2282° F.) and then by calcining the wolframite precursor with PbO at low temperatures, preferably in the temperature range of about 700-950° C. (1292-1742° F.) to form a second pure perovskite phase. When the ternary crystal is PMN-PZ-PT, $PbZrO_3$ is utilized as the second ingredient. $PbTiO_3$ is provided as a third ingredient. Then each of the precursors are mixed together, milled and sieved to form a substantially uniform solid solution mixture. Then, the solid solution mixture is formed into particles that include pure perovskite phases, followed by sintering. Sintering can be accomplished, preferably at temperatures in the range of about 1100-1250° C. (2012-2282° F.). The particles are then charged into a non-reactive crucible, which may be optionally charged with up to 5 mole percent PbO, $Pb_3O_4$, $PbCO_3$ and $Pb_3(CO3)_2(OH)$, $In_2O_3$ and/or MgO to compensate for evaporation losses and to stabilize the perovskite phase during calcining. In addition, the crucible may be charged with up to 2 mole percent $B_2O_3$, and/or $PbF_2$, which serve to lower the melting point of the melt, thereby serving as a crystal growth stabilizer and to stabilize the perovskite phase during crystal growth. The crucible may optionally be charged with up to 5 mole percent Mn, Yb and Sc to enhance the dielectric and piezoelectric properties of the subsequent crystal produced by the melt.

The charged crucible is next heated in a furnace having a first high temperature zone and a second low temperature zone, wherein a temperature gradient is formed between the first zone and the second zone. The first zone is maintained at a temperature above the melting point of the charge, preferably about 10-100° C. (50-212° F.) above the melting point of the charge and the second zone is maintained at a temperature below the melting point of the charge, so that a well-defined temperature gradient exists in the furnace between the first and second temperature zones, preferably this gradient is within the range of 5-40° C./cm. The charge in the crucible is melted by moving the crucible into the first high temperature zone. The charge is moved relative to the first zone at a preselected rate toward the second zone. While this preselected rate may vary, a preferred rate is within the range of about 0.2-2 mm per hour. While the first temperature zone is maintained at a temperature above the melting point of the charge, the second temperature zone is maintained at a temperature below the melting point of the charge. The movement of the charge into the second temperature zone initiates crystal growth from the melt. Alternatively, crystal growth may be initiated by a seed in the second temperature zone. By controlling the temperature gradient at the solid/liquid interface between the melted charge in the crucible and the growing crystal, a ternary single crystal of preselected size is grown into the liquid at the solid/liquid interface. The ternary crystal can be cooled at a preselected rate. For single crystals in the sizes currently produced, this cooling rate preferably is in the range of about 30-100° C./hour (50-180° F./h), but can vary based on the size of the single crystal.

The present invention provides relaxor ternary single crystal piezoelectrics that can be used to form ultrasonic transducers for use in applications in which operational space and cooling capacity is limited, even though power requirements continue to increase, such as sonar. These crystals provide higher Curie temperatures and improved coercive field as compared to available binary single crystals.

Importantly, these ternary single crystal piezoelectrics can be produced by the vertical Bridgeman method. This permits large, single crystals having a diameter of at least about ½ inch and a length of at least about 2 inches, and preferably 4 inches and larger, to be economically produced.

An additional advantage of these ternary single crystal piezoelectrics is that they have a lower dielectric constant variation over their operational temperature ranges as compared to PMN-PT binary crystals, which beneficially affects transducer impedance, the matching circuitry as well as the power delivery system.

A further advantage of the present invention is that the use of precursor methods avoids the formation of deleterious pyrochlore phases that adversely affect single crystal growth by forming defects and polycrystalline grains.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

The present invention utilizes compositions that permit a melt to be made by using precursor formulations. These precursors in turn can be used to generate ternary single crystals using the vertical Bridgeman process. These ternary single crystals have improved Curie temperatures, $T_c$, and improved rhombohedral to tetragonal phase transition temperatures, $T_{rt}$ that allows the single crystals to be used at higher temperatures. This is critical for applications that require high power transmission but in which there is little space and in which cooling capacity is limited, so that operational temperatures are important to control.

Figure 1:
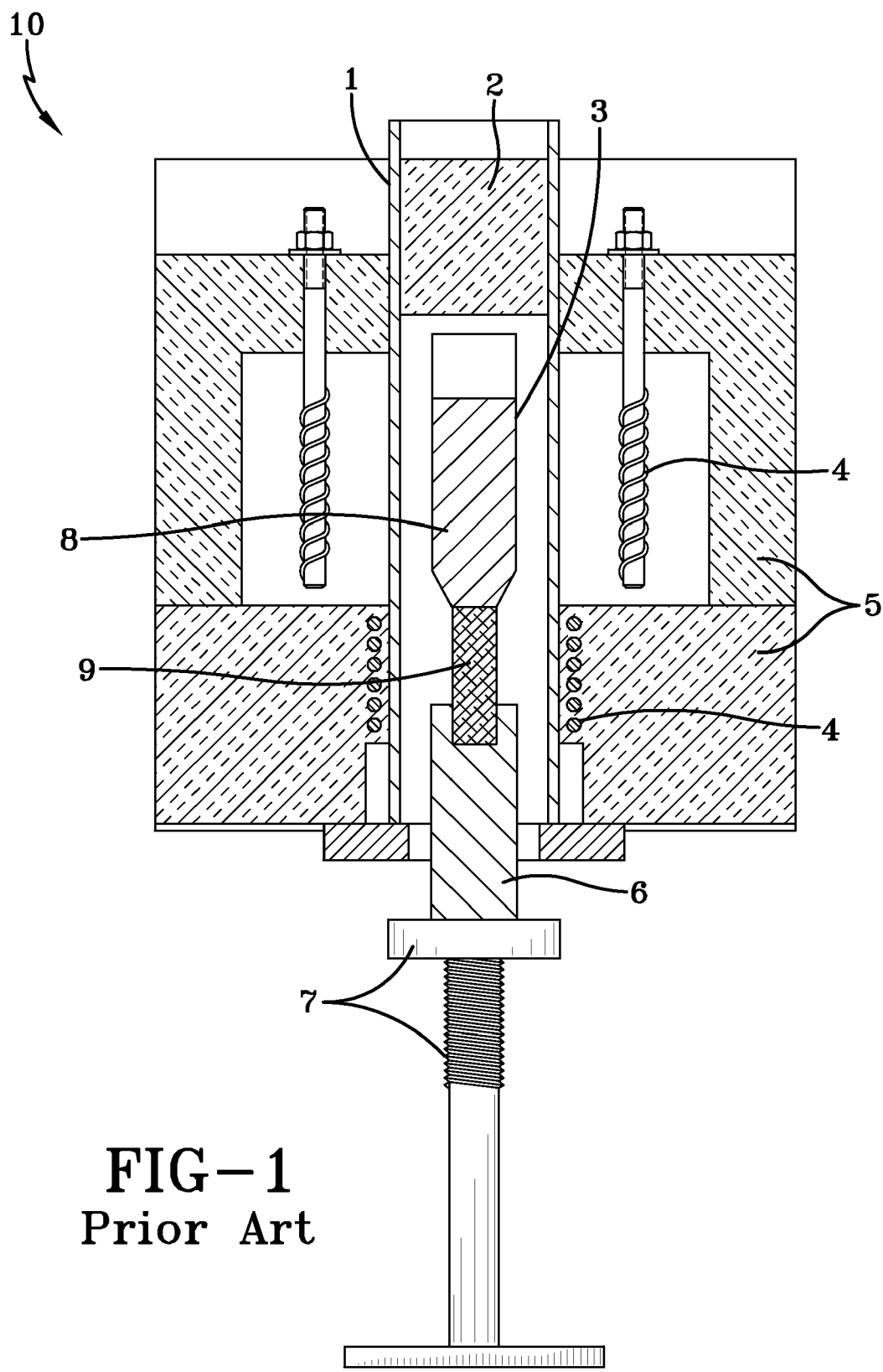
FIG. 1 is a cross-sectional schematic of a vertical Bridgeman furnace having a single crucible.

FIG. 1 is a cross-sectional schematic of a Bridgeman furnace 10 for use in the vertical Bridgeman process having a single crucible. It will be understood that multiple crucibles can be used in the process. These crucibles preferably are non-reactive and are made from or comprise platinum (PT), iridium (IR), rhodium (RH) and combinations thereof. The furnace 10 is positioned on a translational stage 7 that supports an alumina stand 6, allowing it to translate. The working zone of the furnace is surrounded by resistance heaters 4 which in turn is surrounded by thermal insulation 5. The working zone of the furnace comprises an alumina tube 1 and has an upper, hot zone, which is capped by thermal insulation 2, and a lower zone, which is cooler. Within the alumina tube 1 is a crucible 3. The crucible and the alumina stand 6 work together to permit the formation of a casting, which is a single crystal. The crucible 3 holds the melt 8, which melt extends into the hot zone of the furnace. In this schematic, a crystal seed 9 is held by the alumina stand and extends from the lower portion of crucible 3 and into the hot zone so that the end of the seed forms a liquid-solid interface within the crucible. Crystal seed 9 is withdrawn from crucible 3 at a predetermined rate, caused by movement of the translational stage that moves the alumina stand downward. The melt material moves downward with the crystal seed into the slightly cooler temperature zone, causing solidification onto the crystal seed by deposition of molecules or atoms from the melt. If done slowly, with the avoidance of impurities and without spontaneous nucleation, a single layer of crystal is formed on the crystal seed having a diameter about the diameter of the single crystal, which size will get progressively thicker as the crystal seed is withdrawn. The vertical Bridgeman method utilizes the temperature differential between the two zones of the furnace, the high temperature zone being above the melting temperature of the composition and the lower temperature zone being slightly below the melting temperature, to form the single crystal.

The single crystals of the present invention are ternaries of PMN-PT where PMN is $PbMg_{1/3}Nb_{2/3}O_3$, and PT is $PbTiO_3$. The ternary compositions further include one of either PIN, $Pb(In_{1/2}Nb_{1/2})O_3$ or PZ, $PbZrO_3$. These ternary single crystals operate at higher temperature and higher electric fields than current state-of-the-art binary PMT-PT crystals. These ternary single crystals are grown from the melt by the single pass uniaxial solidification process described above as the Vertical Bridgman technique.

Figure 2A:
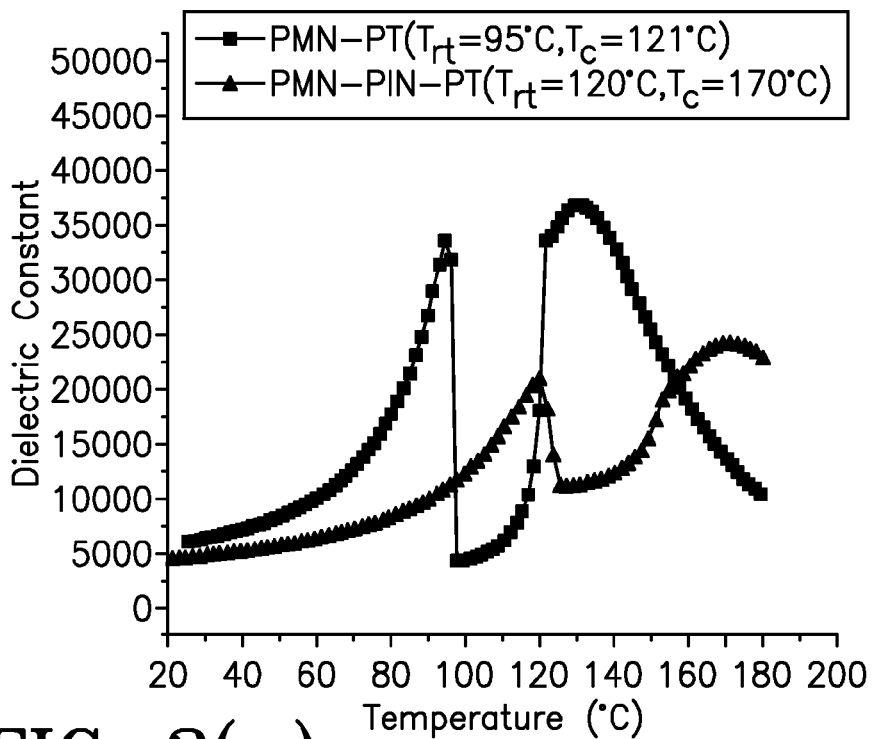
FIGS. 2(a) and 2(b) are graphical comparisons of the dielectric constant vs. temperature variation between PMN-PIN-PT samples and a PMN-28%PT sample.
Figure 2B:
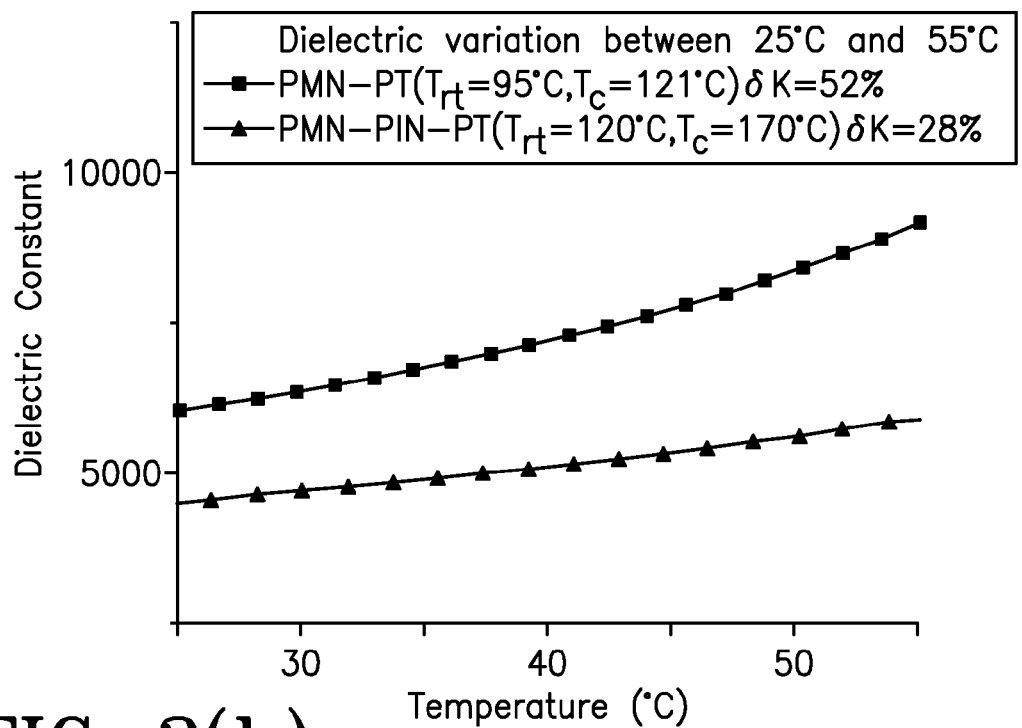

In its broadest embodiment, PIN-PMN-PT comprises, in mole percent, 29% to about 80% PIN, about 1-50% PT, and the balance PMN. A single crystal is grown from a melt of this composition, the single crystal having a crystal orientation in either the [111], [110] or the [001] direction. No PIN-PMN-PT crystals have been grown by the Bridgeman method with PIN concentrations greater than 28 mole % due to the difficulty in preventing the formation of secondary phases, primarily the pyrochlore phase, during the crystal growth process. The methods disclosed herein overcome the limitations of the prior art, permitting single crystals to be grown. Ternary PMN-PIN-PT single crystals within the compositional limits of the present invention possess a $T_c$ of at least 160° C. and a $T_{rt}$ of at least 120°. The ternary system has a $T_{rt}$ elevated by more than 25° C. and an $E_c$ that is improved by 150% as compared to a binary system without PIN. The PIN-PMN-PT falling within the broad compositional range is a single crystal characterized by a Curie temperature $T_c$ of at least 160° C., a rhombohedral to tetragonal phase transition temperature $T_{rt}$ of at least 120° C., a piezoelectric coefficient $d_{33}$ of about 1200-2000 pC/N and a coercive field $E_c$ of 2.5-7.5 kv/cm. FIG. 2 is a graphical comparison of the dielectric constant vs. temperature variation between PMN-PIN-PT samples of the present invention and PMN-28% PT and PMN-31% PT samples, depicting the improvement of the ternary of the present invention over the binary PMN-PT. Table 1 provides a summary of properties of selected ternary PIN-PMN-PT compositions as compared to similar binary PMN-PT compositions.

TABLE 1

Comparison of Dielectric and Piezoelectric Properties between PMN-PIN-PT and PMN-PT

| Composition | 29PIN-40PMN-31PT; | | 36PIN-32PMN-32PT | | | PMN-31% PT | PMN-28% PT |
|---|---|---|---|---|---|---|---|
| $T_c$ (° C.) | 170 | 171 | 175 | 179 | 181 | 151 | 121 |
| $T_{rt}$ (° C.) | 120 | 121 | 130 | 127 | 124 | 82 | 95 |
| $E_c$ (kV/cm) | 5.0 | 4.6 | 4.7 | 4.1 | 4.3 | 2.3 | 2.2 |
| $d_{33}$ (pC/N) | 1750 | 1550 | 1200 | 1390 | 1737 | 1854 | 1564 |
| $K_3$ | 4508 | 3860 | 1780 | 3400 | 6045 | 4570 | 5829 |
| Tanδ (%) | 0.52 | 0.50 | 0.66 | 0.79 | 0.62 | 0.36 | 0.29 |

Figure 3A:
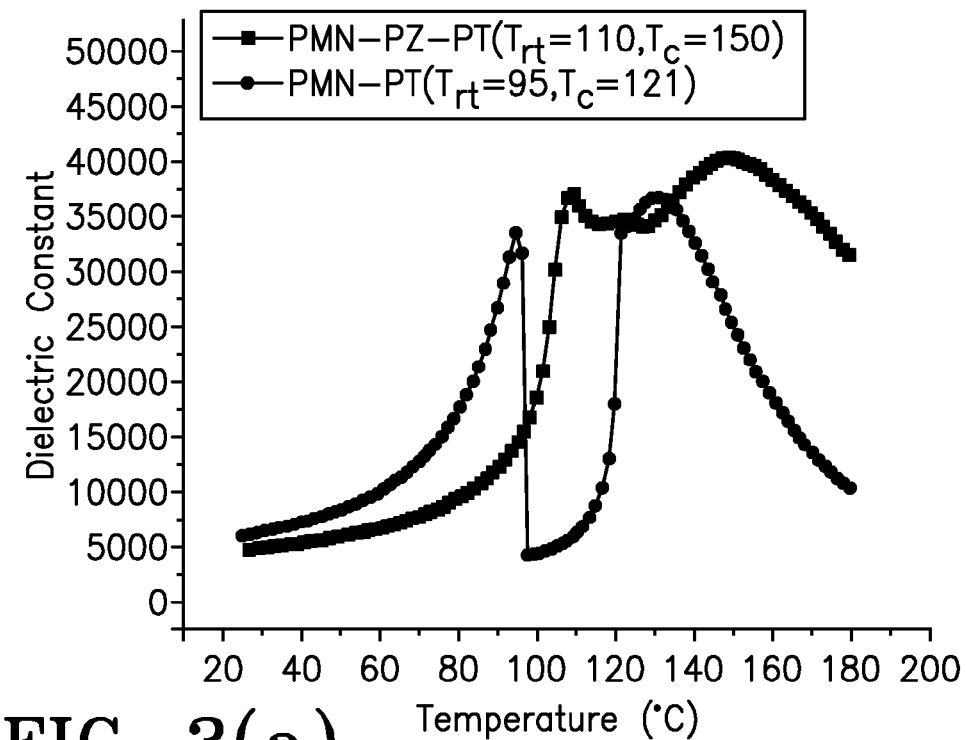
FIGS. 3(a) and 3(b) are graphical comparisons of the temperature variation of the dielectric constant between a PMN-PZ-PT sample and a PMN-PT sample.
Figure 3B:
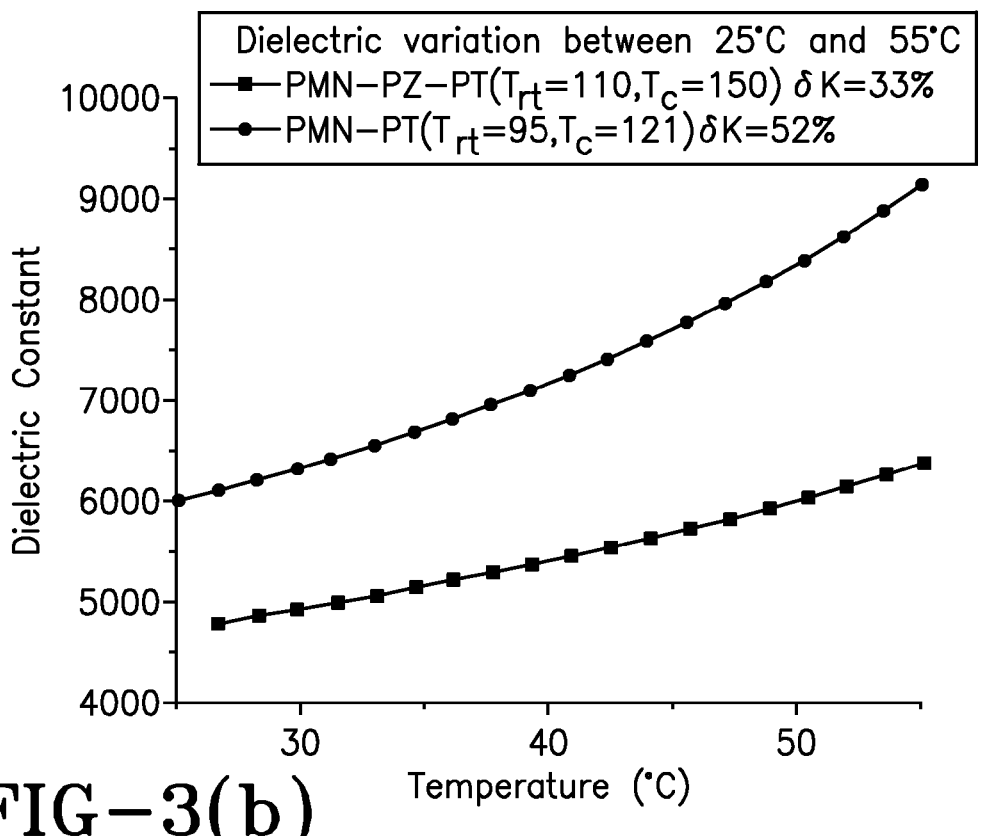

In its broadest embodiment, PMN-PZ-PT comprises, in mole percent, about 1% to about 20% PZ, about 1-50% PT, and the balance PMN. Single crystal growth of PMN-PZ-PT by the Vertical Bridgeman technique has been demonstrated, both with and without the use of single crystal seeds. These demonstrations have further shown that Zr, provided in the PZ, has a significant impact on increasing the operating range of the ternary as compared to a binary. The relationship between dielectric constant and temperature with a zirconium substitution indicates an improvement of rhombohedral-to-tetragonal phase transition temperature over a binary PMN-PT to over 110° C. A single crystal is grown from a melt of this composition, the single crystal having a crystal orientation in either the [111], [110] or the [001] direction. By adding PZ to the PMN-PT to form a ternary, the $T_{rt}$ and $E_c$ were elevated by more than 15° C. and 50% respectively. The dielectric properties and piezoelectric properties remain similar to those of binary PMN-PT crystal. The ternary PMN-PZ-PT falling within the broad compositional range is a single crystal characterized by a Curie temperature $T_c$ of at least 150° C., a rhombohedral to tetragonal phase transition temperature $T_{rt}$ of at least about 110° C., a piezoelectric coefficient $d_{33}$ of at least about 1200pC/N and a coercive field $E_c$ of at least about 3.0 kv/cm. FIGS. 3(a) and 3(b) are graphical comparisons of the temperature variation of the dielectric constant between a ternary PMN-PZ-PT sample of the present invention and a binary PMN-PT sample, depicting the improvement of the ternary of the present invention over the binary PMN-PT. Table 2 provides a summary of properties of selected ternary PMN-PZ-PT compositions as compared to similar binary PMN-PT compositions.

TABLE 2

Summary of the Dielectric and Piezoelectric Properties of PMN-PZ-PT

| Samples | PMN-5% PZ-33% PT | PMN-3% PZ-31% PT | PMN-31% PT | PMN-28% PT |
|---|---|---|---|---|
| $T_c$ (° C.) | 150 | 150 | 151 | 121 |
| $T_{rt}$ (° C.) | 110 | 101 | 82 | 95 |

TABLE 2-continued

Summary of the Dielectric and Piezoelectric Properties of PMN-PZ-PT

| Samples | PMN-5% PZ-33% PT | PMN-3% PZ-31% PT | PMN-31% PT | PMN-28% PT |
|---|---|---|---|---|
| $E_c$ (kV/cm) | 3.1 | 2.8 | 2.3 | 2.2 |
| P ($\mu C/cm^2$) | 25.5 | 24 | 30.6 | 24.9 |
| $d_{33}$ (pC/N) | 1500 | 1600 | 1854 | 1564 |
| $K_3$ | 4691 | 3920 | 4570 | 5829 |

EXAMPLE 1

PMN-PZ-PT Crystal Growth: A typical Bridgman growth of PMN-PZ-PT (3 mole % PZ and 31 mole % PT) crystal is described as follows: Columbite precursor, $MgNb_2O_6$, was presynthesized by mixing, milling and calcining a stoichiometric mixture of MgO and $Nb_2O_5$ powder with 99.99% purity. MgO and $Nb_2O_5$ powder were mixed with ethanol by volume ratio of about 1:4 and then milled by yttrium stabilized zirconia (YSZ) media on a ball mill for about 24 hours. The powder was dried in an oven at about 50° C. (122° F.) and then was sieved through an 80-mesh nylon screen. Finally, the powder was calcined at about 1150° C. (2102° F.) for about 4 hours. Pure columbite phase was confirmed by x-ray diffraction (XRD). The final particle size of $MgNb_2O_6$ was about 2 microns According to the stoichiometry of the ternary compound, PbO (69.004 wt %), $MgNb_2O_6$ (20.82 wt %), $ZrO_2$ (2.52 wt %) and $TiO_2$ (7.656 wt %) were milled by YSZ media on a Sweco vibratory mill for about 16 hours and then dried in an oven at about 50° C. (122° F.). The purity of all raw materials was at least 99.9%. The dried powder was sieved through an 80-mesh nylon screen, and then was calcined at about 950° C. (1742° F.) for about 4 hours. Pure perovskite phase was confirmed by X-ray diffraction (XRD). The synthesized compound was then charged into a tapered platinum (Pt) crucible. The Pt crucible was 15 mm in diameter and 100 mm long with a 10 mm in diameter and 50 mm long seed well. No single crystal seed was charged into the seed well for this run.

A vertical Bridgman furnace as shown in FIG. 1 was used for the crystal growth. The maximum temperatures for the upper and lower heating zones were about 1380° C. (2516° F.) and about 1150° C. (2102° F.), respectively. The vertical temperature gradient along the Pt crucible was about 10-15° C./cm. After the charge was melted, it was soaked at temperature for about 10 hours. Then the crucible was lowered down at a rate of 0.8 mm/hour to initiate the crystal growth process. After moving the crucible down about 150 mm (5.9 in.), the crystallization process driven by the vertical temperature gradient was completed. Then the furnace was cooled down to room temperature in about 20 hours. Single crystal (except for very beginning part of the boule) with diameter of 15 mm (0.6 in.) and about 110 mm (4.3 in.) in axial length was grown roughly along the <111>-orientation.

EXAMPLE 2

PMN-PZ-PT Crystal Growth: A typical Bridgman growth of PMN-PZ-PT (5 mole % PZ and 33 mole % PT) crystal was performed as follows: Columbite precursor, $MgNb_2O_6$, was presynthesized in the same way described in Example 1, above. According to the stoichiometry of the ternary compound but with 1 mol % extra PbO, PbO (68.595 wt %), $MgNb_2O_6$ (19.25 wt %), $ZrO_2$ (4.134 wt %) and $TiO_2$ (8.021 wt %) were weighed and milled with ethanol for 16 hours. All the processes were as in Example 1, except that the powder was calcined at about 850° C. (1562° F.) for about 4 hours. The synthesized compound was then charged into a tapered platinum (Pt) crucible. The Pt crucible was about 15 mm (0.6 in.) in diameter and about 100 mm (3.94 in.) in axial length with a 5 mm diameter and 50 mm long seed well. No single crystal seed was charged into the seed well for this run.

A vertical Bridgman furnace as shown in FIG. 1 was used for the crystal growth. The maximum temperature for the upper and lower heating zones were about 1395° C. (2543° F.) and about 1100° C. (2012° F.), respectively. The vertical temperature gradient along the Pt crucible was about 15-20° C./cm. After the charge was melted, it was soaked for about 6 hours, and then the crucible was lowered down at a rate of 0.6 mm/hour to initiate the crystal growth process. After moving the crucible down about 150 mm (5.9 in.), the crystallization process driven by the vertical temperature gradient was completed. Then the furnace was cooled to room temperature in about 20 hours. A single crystal (except for very beginning part of the boule) with diameter of about 15 mm (0.6 in.) and about 90 mm (3.5 in.) in axial length was grown roughly along <111>-orientation.

EXAMPLE 3

PMN-PIN-PT Crystal Growth: A typical Bridgman growth of PMN-PIN-PT (29 mole % PIN and 31 mole % PT) crystal was performed as follows: Columbite precursor, $MgNb_2O_6$, was presynthesized in the same way described in Example 1. Wolframite precursor, $InNbO_4$, was synthesized by mixing, milling and calcining stoichiometric $In_2O_3$ and $Nb_2O_5$ powder with 99.99% purity. $In_2O_3$ and $Nb_2O_5$ powder was mixed with ethanol by volume ratio of 15:85 and then was milled by YSZ media on a Sweco mill for about 24 hours. The powder was dried in an oven at about 50° C. (122° F.) and then was sieved through an 80-mesh nylon screen. Finally, the powder was calcined at about 1100° C. (2012° F.) for about 4 hours. Pure wolframite phase was confirmed by XRD. The final particle size of $InNbO_4$ was about 2 microns. According to the stoichiometry of the ternary compound but with 0.25 mol % extra PbO, PbO (68.066 wt %), $MgNb_2O_6$ (12.416 wt %), $InNbO_4$ (11.985 wt %) and $TiO_2$ (7.533 wt %) were weighed and milled by YSZ media on a Sweco vibratory mill for about 20 hours and then dried in an oven at about 50° C. (122° F.). The dried powder was sieved through an 80-mesh nylon screen and then was calcined at about 850° C. (1562° F.) for about 4 hours. Pure perovskite phase was confirmed by XRD. The synthesized compound was then charged into a tapered platinum (Pt) crucible as described in Example 1. The Pt crucible was 40 mm in diameter and 145 mm long with a 15 mm in diameter and 75 mm long seed well. A <110>-oriented PMN-PT single crystal seed was placed into the seed well for this example.

A vertical Bridgman furnace as shown in FIG. 1 was used for the crystal growth. The maximum temperature for the upper and lower heating zones were 1405° C. (2561° F.) and 1100° C. (2012° F.), respectively. The vertical temperature gradient along the Pt crucible was about 15~20° C./cm. After the charge was melted, it was soaked for about 12 hours, and then the crucible was lowered down at a rate of 0.8 mm/hour to initiate the crystal growth process. After moving the crucible down about 130 mm (5.1 in.), the crystallization process was completed. Then the furnace was cooled down to room temperature in about 36 hours. A <110>-oriented single crystal with diameter of about 40 mm (1.6 in.) and about ~90 mm (3.5 in.) in axial length was obtained.

EXAMPLE 4

PMN-PIN-PT Crystal Growth: A typical Bridgman growth of PMN-PIN-PT (36 mol % PIN/32 mol % PT and 49 mol % PIN/32 mol % PT) crystals was performed as follows. Columbite precursor, $MgNb_2O_6$, and wolframite precursor, $InNbO_4$, were presynthesized in the same way described in Example 3, except that 1 mol % extra MgO and $In_2O_3$ was added to each precursor, respectively. According to the stoichiometry of the ternary compound, PMN-36 mol % PIN-32 mol % PT, but with 2 mol % extra PbO, PbO (68.003 wt %), $MgNb_2O_6$ (9.753 wt %), $InNbO_4$ (14.609 wt %) and $TiO_2$ (7.635 wt %) were weighed, milled and calcined. According to the stoichiometry of the ternary compound, PMN-49 mol % PIN-32 mol % PT, but with 2 mol % extra PbO, PbO (67.121 wt %), $MgNb_2O_6$ (5.716 wt %), $InNbO_4$ (19.627 wt %) and $TiO_2$ (7.536 wt %) were weighed, milled and calcined. The batching processes of the powder of these two ternary compounds were the same as those described in Example 3. The synthesized compounds were then charged into two tapered platinum (Pt) crucibles. Both of the Pt crucibles were 15 mm in diameter and 100 mm in length with a 10 mm-diameter and 75 mm-long seed well. No single crystal seed was placed into the seed wells.

A vertical Bridgman furnace as shown in FIG. 1 was used for the crystal growth. Both of the charged Pt crucibles were placed in the furnace. The maximum temperature for the upper and lower heating zones were 1385° C. and 1200° C. separately. The vertical temperature gradient along the Pt crucible was about 10-15° C./cm. After the charge was melted, it was soaked for about 12 hours, and then the crucible was lowered down at a rate of 0.2 mm/hour to initiate the crystal growth process. After moving the crucible down about 150 mm, the crystallization process was completed. Then the furnace was cooled down to room temperature in 16 hours. Two single crystal boules with diameter of 15 mm and ~100 mm in length were grown except for the very beginning of each. The portion of each boule that was not single crystal was removed by cutting.

EXAMPLE 5

PMN-PZ-PT Crystal Testing: Piezoelectric and dielectric properties of the single crystals of PMN-3 mol %-PZ-31 mol % PT and PMN-5 mol % PZ-33 mol % PT grown in Examples 1 and 2 were measured. First, the single crystal boules were oriented by the real-time Laue X-ray photography system. Then thin plate samples with width to thickness ratio over 5:1 were cut from the boules with all faces of the plates in {001} family. After grinding and polishing, Au electrodes were sputtered on the pair of large faces. The samples were poled by a pulse poling method (using the Sawyer-Tower polarization and LVDT strain measurement system) along <001> at 10 kV/cm; at the same time, the remnant polarization ($P_r$), coercive field ($E_c$) and piezoelectric coefficient ($d_{33}$) of the samples were measured at a 10 kV/cm field and 1 Hz frequency. Dielectric constant and loss vs. temperature were measured within the temperature range of 20° C. (68° F.) to 200° C. (392° F.) by a HP4174A LCR meter connected to a temperature chamber and controlled by a personal computer. The Curie temperature ($T_c$) and rhombohedral-to-tetragonal phase transition temperature ($T_{rt}$) were then determined by the maximum peaks of the dielectric constant. For the purpose of comparison, two binary PMN-PT crystal samples with the same cutting orientation were chosen and tested as well. For a binary PMN-PT crystal, it is believed that the rhombohedral phase with the composition close to the morphotropic phase boundary (MPB) possesses the optimal dielectric and piezoelectric properties. The compositions with 28-32 mol % PT mol concentrations were usually considered as the most desired, since they exhibit extremely high strain levels and electromechanical coupling coefficient. The $T_{rt}$ of such crystals is usually in the range of about 80-95° C. (176-203° F.), which decreases as PT concentration increases. In this experiment, PMN-PT single crystal with PT concentration around 28 mol % and 32 mol % were chosen for the comparison. The measured dielectric and piezoelectric properties are shown in Table 1. PMN-PZ-PT crystals with PZ concentrations of about 3-5 mol % can elevate $T_{rt}$ to about 110° C. (230° F.) which is about 15° C. higher than pure binary PMN-PT crystal, while keep the piezoelectric constant, $d_{33}$, similar to pure binary PMN-PT crystal. FIG. 3 compares the dielectric constant vs. temperature curves between a ternary PMN-5% PZ-33% PT and a binary PMN-28% PT crystal. This PMN-PT sample has relatively low PT concentration and high $T_{rt}$ temperature, about 95° C. (203° F.), which is the highest value for commercial PMN-PT crystals. It is shown that Zr substitution increased both $T_c$ and $T_{rt}$, while the dielectric constant variation was reduced. The ternary PMN-PZ-PT sample of FIG. 3 shows a 33% dielectric constant variation over the temperature range of 25° C. to 55° C. (77° F.-131° F.), which is significantly less than the PMN-PT crystal sample (52%).

EXAMPLE 6

PMN-PIN-PT Crystal Testing: Piezoelectric and dielectric properties of the single crystals of PMN-29 mol % PIN-31 mol % PT and PMN-36 mol % PIN-32 mol % PT grown in EXAMPLES 3 and 4 have been measured. First, the single crystal boules were checked and oriented by the real-time Laue X-ray photography system. Then, thin plate samples with a width to thickness ratio over 5:1 were cut from the boules with all faces of the plates in {001} family. After grinding and polishing, Au electrodes were sputtered on the pair of large faces. The samples were poled by a pulse poling method (using the Sawyer-Tower polarization and LVDT strain measurement system) along <001> at 10 kV/cm; at the same time, the remnant polarization ($P_r$), coercive field ($E_c$) and piezoelectric coefficient ($d_{33}$) of the samples were measured at a 10 kV/cm field and 1 Hz frequency. Dielectric constant and loss vs. temperature were measured within the temperature range 0° C. to 180° C. (32-356° F.) or 37.5° C. to 300° C. (100-572° F.) by a HP4174A LCR meter connected to a temperature chamber and a personal computer functioning as a temperature controller. $T_c$ and $T_{rt}$ were then determined by the maximum peaks of the dielectric constant. The same two binary PMN-PT crystal samples of Example 5 were chosen for the purpose of comparison. The measured dielectric and piezoelectric properties are shown in Table 1. Ternary PMN-PIN-PT crystals with PIN concentration around 29 mol % exhibit elevated $T_{rt}$ to about 120° C. (248° F.), which is about 25° C. (45° F.) higher than pure binary PMN-PT crystal, while the crystals possess slightly lower dielectric constant. Ternary PMN-PIN-PT crystals with PIN concentration around 36 mol % can elevate $T_{rt}$ to about 130° C. (266° F.), which is about 35° C. (63° F.) higher than pure PMN-PT crystal, while crystals possess a slightly lower dielectric constant. The measured $E_c$ was about 4~6 kV/cm, which shows about a 150% improvement over pure binary PMN-PT crystals. Ternary PMN-PIN-PT crystals with the PIN concentrations of about 29% and about 36% have a piezoelectric constant, d33, similar to that of pure binary PMN-PT crystals. As shown in FIG. 2, it is also found that ternary PMN-PIN-PT samples showed much flatter dielectric constant vs. temperature curves until reaching the $T_{rt}$ temperature. In the temperature range of about 25° C. to 55° C. (77-131° F.), ternary PMN-PIN-PT samples only have 28% variation, while binary PMN-28%PT samples, which have nearly the highest $T_{rt}$, about 95° C. (203° F.), among all the different binary PMN-PT compositions, showed 52% variation in the same temperature range.

The present invention teaches how to grow ternary single crystal relaxor ferroelectrics in the classes of PMN-PIN-PT and PMN-PZ-PT. These ternary single crystals further display higher Curie temperatures, which allow them to be used in applications in which heat build up is a concern, such as heavy duty sonar transducer applications in which removal of additional heat due to increased power is a concern. In addition, the ternary single crystals of the present invention indicate less dielectric constant variation (flatter dielectric constant) with increasing temperature than binary single crystals of PMN-PT. This characteristic strongly suggests that the ternary single crystals of the present invention will provide a better power delivery system over a broad temperature range. In certain uses such as heavy duty transducer applications, this would indicate better matching of the transducer to the electrical circuitry as well as positively affecting transducer impedance. The ternary single crystals of the present invention also have an improved coercive field as compared to binary single crystals. This means that in high driving bipolar applications, less of an electrical bias, or no electrical bias, have to be applied to the transducer crystal in order to prevent depoling. Furthermore, because the methods of the present invention permit the growth of single crystals (ternary) of adequate size for high power applications, high performance over the wider temperature range that likely will occur at these high power applications can be achieved.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A ternary single crystal relaxor piezoelectric, comprising, in mole percent:
   36% to about 80% $Pb(In_{1/2}Nb_{1/2})O_3$;
   about 10-50% $PbTiO_3$; and
   the balance $Pb(Mg_{1/3}Nb_{2/3})O_3$;
   wherein the single crystal is grown from a melt and has a crystal orientation in a direction selected from the group consisting of [111], [110] and [001]; and
   wherein the single crystal is characterized by a Curie temperature $T_c$ of at least about 160° C., a rhombohedral to tetragonal phase transition temperature $T_{rt}$ of at least about 120° C. and a piezoelectric coefficient $d_{33}$ in the range of at least about 1200 pC/N and a coercive field $E_c$ in the range of 2.5-7.5 kv/cm.

2. The ternary single crystal relaxor piezoelectric of claim 1, further comprising, in mole percent:
   about 36% $Pb(In_{1/2}Nb_{1/2})O_3$;
   about 32% $PbTiO_3$;
   the balance $Pb(Mg_{1/3}Nb_{2/3})O_3$;
   wherein the single crystal is characterized by a Curie temperature $T_c$ of 175°-181° C., a rhombohedral to tetragonal phase transition temperature $T_{rt}$ of 124°-130° C. and a piezoelectric coefficient $d_{33}$ in the range of about 1200-1737 pC/N and a coercive field $E_c$ in the range of 4.1-4.7 kv/cm, a length of at least about 2.0 inch and a diameter of at least about ½ inch.

3. A ternary single crystal relaxor piezoelectric, comprising, in mole percent:
   29% to about 80% $Pb(In_{1/2}Nb_{1/2})O_3$;
   about 31-50% $PbTiO_3$; and
   the balance $Pb(Mg_{1/3}Nb_{2/3})O_3$,
   wherein the single crystal is grown from a melt and has a crystal orientation in a direction selected from the group consisting of [111], [110] and [001]; and
   wherein the single crystal is characterized by a Curie temperature $T_c$ of at least 170, a rhombohedral to tetragonal phase transition temperature $T_{rt}$ of about 120° C. and a piezoelectric coefficient $d_{33}$ of about 1200-2000 pC/N and a coercive field $E_c$ of 2.5-5.0 kv/cm.

4. The ternary single crystal relaxor piezoelectric of claim 3, further comprising,
   about 29% $Pb(In_{1/2}Nb_{1/2})O_3$;
   about 31% $PbTiO_3$;
   the balance $(PbMg_{1/3}Nb_{2/3})O_3$;
   wherein the single crystal is characterized by a Curie temperature $T_c$ of 170-171° C., a rhombohedral to tetragonal phase transition temperature $T_{rt}$ of 120-121° C. and a piezoelectric coefficient $d_{33}$ in the range of about 1550-1750 pC/N and a coercive field $E_c$ in the range of 4.6-5.0 kv/cm, a length of at least about 2.0 inch and a diameter of at least about ½ inch.

5. A ternary single crystal relaxor piezoelectric, comprising, in mole percent:
   29% $Pb(In_{1/2}Nb_{1/2})O_3$;
   31% $PbTiO_3$;
   the balance $Pb(Mg_{1/3}Nb_{2/3})O_3$;
   wherein the single crystal is characterized by a Curie temperature $T_c$ of 170-171° C. and a rhombohedral to tetragonal phase transition temperature $T_{rt}$ of 120-121° C.

6. The piezoelectric of claim 5 further including a piezoelectric coefficient $d_{33}$ in the range of about 1550-1750 pC/N and a coercive field $E_c$ in the range of 4.6-5.0 kv/cm.

7. The piezoelectric of claim 5 further comprising a length of at least about 2.0 inch and a diameter of at least about ½ inch.

8. A method for fabricating a relaxor ternary single crystal piezoelectric material comprising the steps of:
   providing a columbite precursor by high temperature calcining $Nb_2O_3$ and $MgO$;
   forming a pure perovskite phase by calcining the columbite precursor with PbO at low temperatures;
   providing a wolframite precursor by high temperature calcining $Nb_2O_3$ and $In_2O_3$;
   forming a pure perovskite phase by calcining the wolframite precursor with PbO at low temperatures;
   providing $PbTiO_3$;
   mixing, milling and sieving $PbTiO_3$ with the pure perovskite phase formed by calcining the columbite precursor with PbO and with the pure perovskite phase formed by calcining the wolframite precursor with PbO to form a solid solution mixture;

forming the solid solution mixture into particles that includes pure perovskite phases;
sintering the charge by heating;
charging the sintered particles into a non-reactive crucible;
optionally charging into the crucible, in mole percent, up to about 2% $B_2O_3$ and up to about 2% $PbF_2$ to stabilize the perovskite phases during crystal growth;
optionally charging, in mole percent, up to about 5% PbO, $Pb_3O_4$, $PbCO_1$, $Pb_3(CO_3)_2(OH)$, up to about 5% MgO, and up to about 5% $In_2O_3$ into the crucible to compensate for evaporation losses and to stabilize the perovskite phases during calcining;
optionally charging into the crucible, in mole percent, up to about 5% Mn, up to about 5% Yb and up to about 5% Sc into the crucible, wherein the dielectric and piezoelectric properties of the grown crystal are enhance;
heating the charged crucible in a furnace having a first high temperature zone and a second low temperature zone wherein a temperature gradient is formed between the first zone and the second zone, wherein the first zone is maintained at a temperature above the melting point of the charge and the second zone is maintained at a temperature below the melting point of the charge;
melting the charge by bringing the crucible within the first zone;
moving the charge relative to the first zone at a preselected rate into the second zone to initiate crystal growth from the melt;
controlling a temperature gradient at a solid/liquid interface between the melted charge and the growing crystal to form a ternary single crystal of preselected size, having a composition comprising, in mole percent
36% to about 80% $Pb(In_{1/2}Nb_{1/2})O_3$;
about 10-50% $PbTiO_3$; and
the balance $Pb(Mg_{1/3}Nb_{2/3})O_3$;
wherein the single crystal is grown from a melt and has a crystal orientation in a direction selected from the group consisting of [111], [110] and [001]; and
wherein the single crystal is characterized by a Curie temperature $T_c$ of at least about 160° C., a rhombohedral to tetragonal phase transition temperature $T_{rt}$ of at least about 120° C. and a piezoelectric coefficient $d_{33}$ in the range of at least about 1200 pC/N and a coercive field $E_c$ in the range of 2.5-7.5 kv/cm.

9. The method of claim 8 wherein the step of providing a columbite precursor by high temperature calcining includes calcining at a temperature in the range of 1050-1250° C.

10. The method of claim 8 wherein the step of providing a wolframite precursor by high temperature calcining includes calcining at a temperature in the range of about 1050-1250° C.

11. The method of claim 8 wherein the step of forming a pure perovskite phase by calcining the columbite precursor with PbO at low temperatures includes calcining in the temperature range of about 700-950° C.

12. The method of claim 8 wherein the step of forming a pure perovskite phase by calcining the wolframite precursor with PbO at low temperatures includes calcining in the temperature range of about 700-950° C.

13. The method of claim 8 wherein the step of forming solid solution particles and sintering includes sintering in the temperature range of about 1100-1250° C.

14. The method of claim 8 wherein the step of heating the charged crucible in a furnace having a first high temperature zone and a second low temperature zone includes heating the first zone to a temperature 10-100° C. above the melting point of the charge with a temperature gradient is 5-40° C./cm between the first and second zones.

15. The method of claim 8 wherein the step of moving the charge at a preselected rate includes moving the charge at a rate of about 0.2-2 mm per hour.

16. The method of claim 8 further including the additional step of cooling the ternary single crystal of preselected size at a rate of about 30-100° C. per hour.

17. The method of claim 8 wherein the step of charging the solid solution particles into a non-reactive crucible includes charging the particles into the crucible, the crucible comprising at least one element selected from the group consisting of platinum, iridium and rhodium.

* * * * *